US008918988B2

(12) United States Patent
Fayaz et al.

(10) Patent No.: US 8,918,988 B2
(45) Date of Patent: Dec. 30, 2014

(54) METHODS FOR CONTROLLING WAFER CURVATURE

(75) Inventors: Mohammed Fazil Fayaz, Pleasantville, NY (US); Jeffery Burton Maxson, New Windsor, NY (US); Anthony Kendall Stamper, Williston, VT (US); Daniel Scott Vanslette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/604,820

(22) Filed: Sep. 6, 2012

(65) Prior Publication Data
US 2012/0329265 A1  Dec. 27, 2012

Related U.S. Application Data

(62) Division of application No. 12/547,566, filed on Aug. 26, 2009, now Pat. No. 8,299,615.

(51) Int. Cl.
| H05K 3/30 | (2006.01) |
| H01L 23/522 | (2006.01) |
| H01L 23/31 | (2006.01) |
| H01L 21/768 | (2006.01) |
| H01L 23/00 | (2006.01) |

(52) U.S. Cl.
CPC ..... *H01L 23/522* (2013.01); *H01L 2224/13022* (2013.01); *H01L 24/11* (2013.01); *H01L 23/3157* (2013.01); *H01L 2924/3511* (2013.01); *H01L 2224/131* (2013.01); *H01L 2924/01019* (2013.01); *H01L 21/76801* (2013.01); *H01L 2224/05572* (2013.01); *H01L 24/13* (2013.01); *H01L 24/03* (2013.01); *H01L 24/05* (2013.01); *Y10S 438/925* (2013.01)
USPC .......... 29/832; 29/592.1; 29/825; 29/829; 29/835; 29/844; 29/847; 29/853; 438/925; 438/614; 438/622; 257/E29.005; 257/775; 257/E21.582; 716/100; 716/112; 716/118; 716/135

(58) Field of Classification Search
USPC ........ 29/592.1, 825, 829, 832, 835, 844, 847, 29/853; 438/925, 614, 622; 257/E29.005, 257/775, E21.582; 716/100, 112, 118, 135
See application file for complete search history.

(56) References Cited

U.S. PATENT DOCUMENTS

| 5,874,351 | A | 2/1999 | Hu et al. |
| 6,156,623 | A | 12/2000 | Hendrix et al. |
| 6,222,196 | B1 * | 4/2001 | Mack ................. 250/492.21 |
| 6,383,916 | B1 | 5/2002 | Lin |
| 6,403,459 | B1 | 6/2002 | Ohashi et al. |
| 6,782,512 | B2 * | 8/2004 | Asakawa ................. 438/626 |

(Continued)

OTHER PUBLICATIONS

Office Action (Mail Date Jan. 11, 2012) for U.S. Appl. No. 12/547,566, filed Aug. 26, 2009; Confirmation No. 5527.
Amendment filed Apr. 2, 2012 in response to Office Action (Mail Date Jan. 11, 2012) for U.S. Appl. No. 12/547,566, filed Aug. 26, 2009; Confirmation No. 5527.
Final Office Action (Mail Date Apr. 30, 2012) for U.S. Appl. No. 12/547,566, filed Aug. 26, 2009; Confirmation No. 5527.

(Continued)

*Primary Examiner* — Peter DungBa Vo
*Assistant Examiner* — Azm Parvez
(74) *Attorney, Agent, or Firm* — Schmeiser, Olsen & Watts; David Cain

(57) ABSTRACT

Methods and structures for controlling wafer curvature during fabrication of integrated circuits caused by stressed films. The methods include controlling the conductor density of wiring levels, adding compensating stressed film layers and disturbing the continuity of stress films with the immediately lower layer. The structure includes integrated circuits having compensating stressed film layers.

15 Claims, 6 Drawing Sheets

FIG. 10

(56) References Cited

U.S. PATENT DOCUMENTS

| | | |
|---|---|---|
| 6,908,841 B2 | 6/2005 | Burrell et al. |
| 7,067,902 B2 * | 6/2006 | Hichri et al. .................. 257/621 |
| 7,285,831 B2 | 10/2007 | Jung et al. |
| 7,985,653 B2 * | 7/2011 | Lee et al. ....................... 438/381 |
| 8,021,918 B2 | 9/2011 | Lin et al. |
| 8,024,673 B2 * | 9/2011 | Nitta ............................... 716/50 |
| 2003/0229875 A1 * | 12/2003 | Smith et al. ..................... 716/10 |
| 2011/0049723 A1 | 3/2011 | Fayaz et al. |

OTHER PUBLICATIONS

Amendment After Final filed Jun. 28, 2012 in response to Final Office Action (Mail Date Apr. 30, 2012) for U.S. Appl. No. 12/547,566, filed Aug. 26, 2009; Confirmation No. 5527.

Notice of Allowance (Mail Date Jul. 9, 2012) for U.S. Appl. No. 12/547,566, filed Aug. 26, 2009; Confirmation No. 5527.

* cited by examiner

METHODS FOR CONTROLLING WAFER CURVATURE

RELATED APPLICATIONS

This application is a division of U.S. patent application Ser. No. 12/547,566 filed on Aug. 26, 2009, now U.S. Pat. No. 8,299,615, issued Oct. 30, 2012.

FIELD OF THE INVENTION

The present invention relates to the field of integrated circuit manufacture; more specifically, it relates to methods and structures for controlling wafer curvature.

BACKGROUND OF THE INVENTION

In an effort to increase productivity, the size of semiconductor wafers has increased in order to fabricate more integrated circuit chips on each individual wafer. However, as the wafer size has increased, wafer curvature has increased which can cause numerous manufacturing problems as integrated circuit processes and equipment require flat substrates for maximum yield, reliability and consistency of finished product. Accordingly, there exists a need in the art to mitigate or eliminate the deficiencies and limitations described hereinabove.

SUMMARY OF THE INVENTION

A first aspect of the present invention is a method, comprising: selecting a wiring level design of an integrated circuit design, the design defining a physical wiring level of an integrated circuit chip on a wafer, wherein wires of the wiring level are formed of an electrical conductor in internal tensile stress and an interlevel dielectric layer of the wiring level is in internal tensile stress; determining if an electrical conductor shape density of the wiring level design is within a predefined range; if the shape density is below a lower limit of the range, increasing the shape density or if the shape density is greater than an upper limit of the range, decreasing the shape density; and fabricating the one or more of the integrated circuit chips on the wafer using wiring level design.

A second aspect of the present invention is a method, comprising: forming multiple wiring levels on a wafer from a first wiring level nearest the wafer to a last wiring level, each wiring level of the of multiple wiring levels comprising respective damascene wires in a respective interlevel dielectric layer; forming a dielectric passivation layer on the last wiring level of the multiple wiring levels and a polyimide layer on the passivation layer, the polyimide layer in internal tensile stress; and wherein at least one compensating dielectric layer formed above the first wiring level is in internal compressive stress.

A third aspect of the present invention is a structure, comprising: multiple wiring levels on a wafer from a first wiring level nearest the wafer to a last wiring level, each wiring level of the of multiple wiring levels comprising respective damascene wires in a respective interlevel dielectric layer; a dielectric passivation layer on the last wiring level of the multiple wiring levels and a polyimide layer on the passivation layer, the polyimide layer in internal tensile stress; and at least one compensating dielectric layer formed above the first wiring level, the one or more compensating dielectric layers in internal compressive stress.

A fourth aspect of the present invention is a method, comprising: forming multiple wiring levels on a wafer from a first wiring level nearest the wafer to a last wiring level, each wiring level of the of multiple wiring levels comprising damascene wires in an interlevel dielectric layer; forming a terminal dielectric layer on the last wiring level of the multiple wiring levels; forming terminal pads on the terminal dielectric layer; forming a dielectric passivation layer on the terminal dielectric layer; forming a polyimide layer on the passivation layer, the polyimide layer internally in tensile stress; and forming vias and trenches in the polyimide layer, the terminal pads exposed in bottoms of the vias, the passivation layer but not the terminal pads exposed in bottoms of the trenches.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

When highly stressed films are formed on wafers during the manufacture of the wiring levels of integrated circuits, the films can cause the wafer to curve (e.g. bend, warp) under three general conditions. The first condition is the use of "hard" low-K (dielectric constant) interlevel dielectric films to reduce parasitic capacitance. Many of these low-K (K greater than or equal to about 10) dielectric films are under high internal compressive stress. For example, plasma enhanced chemical vapor deposition (PECVD) fluoro-tetra-ethoxysilane (FTEOS) internal compressive stress levels are between about $-1.5E9$ dynes/cm$^2$ to about $-2.0E9$ dynes/cm$^2$ as opposed to PECVD TEOS (no fluorine) which have an internal compressive stress level of about $-5E8$ dynes/cm$^2$. The second condition is the use of very thick copper (Cu), aluminum-copper (AlCu) and tungsten (W) films in the wiring levels of integrated circuits for inductors and transmission lines. For example, wires of about 6 micron thick Cu and about 4 micron thick AlCu have a high internal tensile stress (e.g. about 1.4E9 dynes/cm$^2$). The third condition is the use of very thick polyimide passivation films (e.g., about 10 microns or greater), which have an internal tensile stress of (e.g. about 5E8 dynes/cm$^2$). The embodiments of the present invention mitigate or eliminate these conditions.

Figure 1:
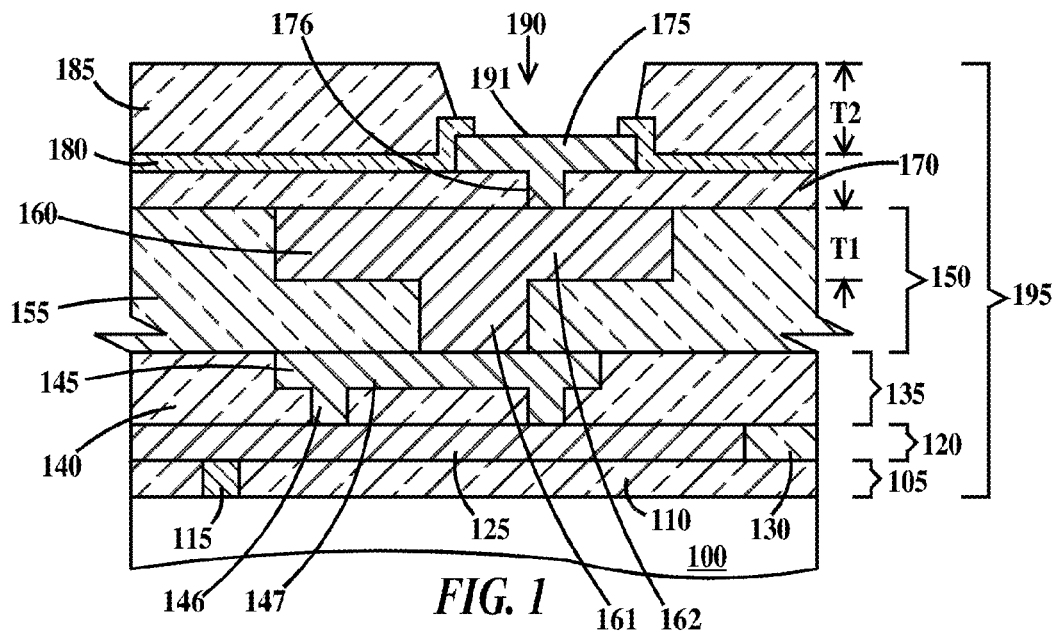
FIG. 1 is a cross-section of an exemplary integrated circuit chip.

FIG. 1 is a cross-section of an exemplary integrated circuit chip. In FIG. 1, formed on a wafer 100 is a first wiring level 105 comprising an interlevel dielectric layer (ILD) 110 and an electrically conductive damascene contact 115. Contact 115 extend all the way through ILD 110. Formed on a top surface of first wiring level 105 is a second wiring level 120 comprising an ILD 130 and electrically conductive damascene wire 125. Wire 125 extends all the way through ILD 130. Formed on a top surface of second wiring level 120 is a third wiring level 135 comprising an ILD 140 and an electrically conductive dual-damascene wire 145. Integral via portions 146 of wire 145 extend all the way through ILD 140 and a wire portion 147 of wire 145 does not extend all the way through ILD 140. Formed on a top surface of third wiring level 135 is a fourth wiring level 150 comprising an ILD 155 and an electrically conductive thick dual-damascene wire 160. An integral via portion 161 of wire 160 extends all the way through ILD 155 and a wire portion 162 of wire 160 does not extend all the way through ILD 155. Formed on a top surface of fourth wiring level 150 is a terminal dielectric layer 170. Formed on top of terminal dielectric layer 170 is an electrically conductive terminal pad 175. A portion of terminal pad 175 extends through all the way through a via 176 formed in terminal dielectric layer 170. Formed on top of terminal dielectric layer 170 and overlapping the perimeter of terminal pad 175 is a dielectric passivation layer 180. Formed on top of passivation layer 180 is a polyimide layer 185. A via 190 is formed though passivation layers 180 and polyimide layer 185 to expose portion of top surface 191 of terminal pad 175. While one contact and three wiring levels are illustrated in FIG. 1, there may be more or less than three wiring levels. Though only one contact or wire is illustrated in FIG. 1, there are multiple contacts and wires per level.

Damascene wires are formed by a damascene process. A damascene process is one in which wire trenches or via openings are formed in a dielectric layer, an electrical conductor of sufficient thickness to fill the trenches is deposited in the trenches and on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

Dual-damascene wires are formed by a dual-damascene process. A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Hereinafter, the term "damascene wire" is intended to include both single-damascene and dual damascene wires.

Wafer 100 is typically formed from a semiconductor material such as silicon or comprises a silicon-on-insulator (SOI) substrate and may include devices such as field effect transistors, bipolar transistors, diodes, resistors and capacitors. Wiring levels 105, 120, 135, 150, terminal dielectric layer 170, terminal pad 175 and first and second passivation layers 180 and 185 comprise an interconnect film stack 195 of an integrated circuit that wire the devices in wafer 120 into circuits.

Wire 160 has a maximum thickness T1 and second passivation layer has a maximum thickness T2. Wire 160 comprises copper (Cu), aluminum-copper (AlCu) or tungsten (W). T1 is about 6 microns or greater when wire 160 is Cu, and about 4 microns or greater when wire 160 is AlCu. T2 is at least about 10 microns. The thicknesses T1 and T2 are limiting thicknesses in that below about 6 micron for T1 and below about 10 microns for T2, the stress induced into wafer 100 respectively by wire 160 and polyimide passivation 185 does not create significant wafer curvature problems.

In one example, dielectric layers 110, 130. 140. 155, 170 and 180 are independently selected from the group consisting of porous or nonporous silicon dioxide ($SiO_2$), fluorinated $SiO_2$ (FSG), TEOS, FTEOS, silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$), NBLok (SiC(N,H)) and a low K (dielectric constant) material such as, hydrogen silsesquioxane polymer (HSQ), methyl silsesquioxane polymer (MSQ), organosilicate glass (methyl doped silica or $SiO_x(CH_3)_y$ or $SiC_xO_yH_y$ or SiCOH) and polyphenylene oligomer (e.g., SiLK™ manufactured by Dow Chemical Company of Midland Tex.) or combinations thereof.

In one example, contacts 115 may comprise W, wires 125, 145 and 160 may independently comprise one or more layers of W, Cu, Al, AlCu, tantalum (Ta), tantalum nitride (TaN), titanium (Ti) and titanium nitride (TiN). In one example, terminal pad 175 comprises Al or AlCu.

Figure 2:
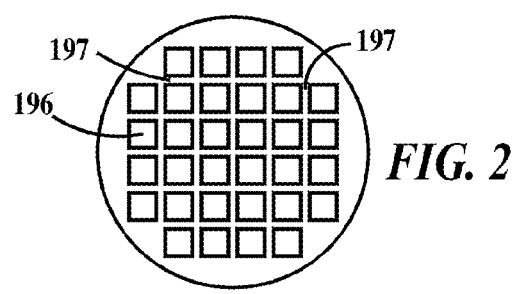
FIG. 2 is a top view of an exemplary wafer illustrating an arrangement of integrated circuit chips at steps prior to singulation of the wafer into individual integrated circuit chips.

FIG. 2 is a top view of an exemplary wafer illustrating an arrangement of integrated circuit chips at steps prior to singulation of the wafer into individual integrated circuit chips. Wafer 100 is a circular disk. In FIG. 2, wafer 100 includes and array of integrated circuit chips 196 separated by streets 197. After fabrication is complete, wafer 100 is singulated (e.g., diced) into individual chips along streets 197.

Figure 3:
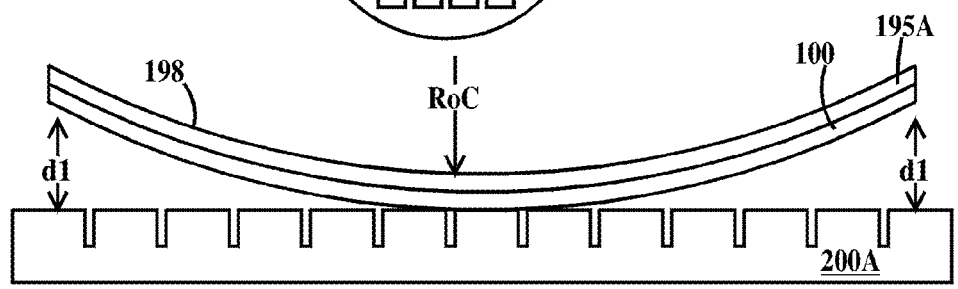
FIG. 3 is a cross-section of an exemplary wafer illustrating the effect of positive wafer curvature during chucking.

FIG. 3 is a cross-section of an exemplary wafer illustrating the effect of positive wafer curvature during chucking. In FIG. 3, wafer 100 has a net compressive film stack 195A, which causes a concave warping of wafer 100 with relative to a top surface 198 of film stack 195A. While the center of wafer 100 contacts a vacuum chuck 200A, the perimeter of wafer 100 is a distance d1 above chuck 200A. While electrostatic chucks are also affected, concavity is a particularly difficult problem with vacuum chucks, which rely on a difference in pressure to flatten the wafer, which difference cannot be established at the perimeter when d1 is too great.

Figure 4:
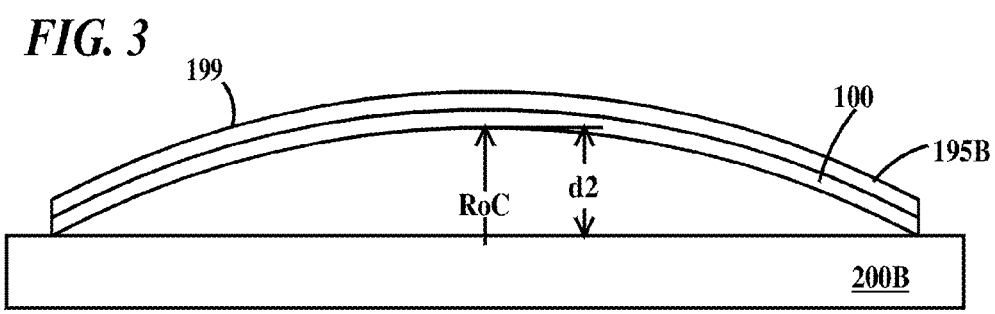
FIG. 4 is a cross-section of an exemplary wafer illustrating the effect of negative wafer curvature during chucking.

FIG. 4 is a cross-section of an exemplary wafer illustrating the effect of negative wafer curvature during chucking. In FIG. 3, wafer 100 has a net tensile film stack 195B, which causes a convex warping of wafer 100 relative to a top surface 199 of film stack 195A. While the perimeter of wafer 100 contacts a electrostatic chuck 200B, the center of wafer 100 is a distance d2 above chuck 200B. While vacuum chucks are also affected, convexity is a particularly difficult problem with electrostatic chucks, which rely on a difference charge between the wafer, and chuck to flatten the wafer, which difference in charge cannot generate a strong enough attraction in the center when d2 is too great.

In FIGS. 3 and 4, the amount of concavity or convexity is measured in terms of radius of curvature (RoC) where the greater the absolute value of the radius of curvature (|RoC|), the less concavity or convexity. The greater |RoC| the flatter the wafer. For a 300 mm diameter wafer, |RoC| of less than about 25 meters has been shown to cause manufacturing problems. Examples where physical excess concavity or convexity may cause a problem are variations in across wafer image size in photolithographic exposure tools and etching tools, non-uniformity in photoresist thickness in apply tools, non-uniformity in film thickness in CMP tools, and non-uniformity of film thickness in deposition tools. Besides just changing the distance between the wafer and chuck from perimeter to center, the distance differences can result in unwanted thermal gradients across the wafer, which is of particular concern in deposition, etch, CMP, photolithographic exposure, and annealing processes. The fabrication steps of solder bumps (i.e., controlled chip collapse connects, C4) and solder columns on terminal pads of integrated are particularly sensitive to wafer curvature. The embodiments of the present invention may be applied to any size wafer, including 200 mm diameter wafers, 300 mm diameter wafers and wafers exceeding 300 mm in diameter.

Figure 5:
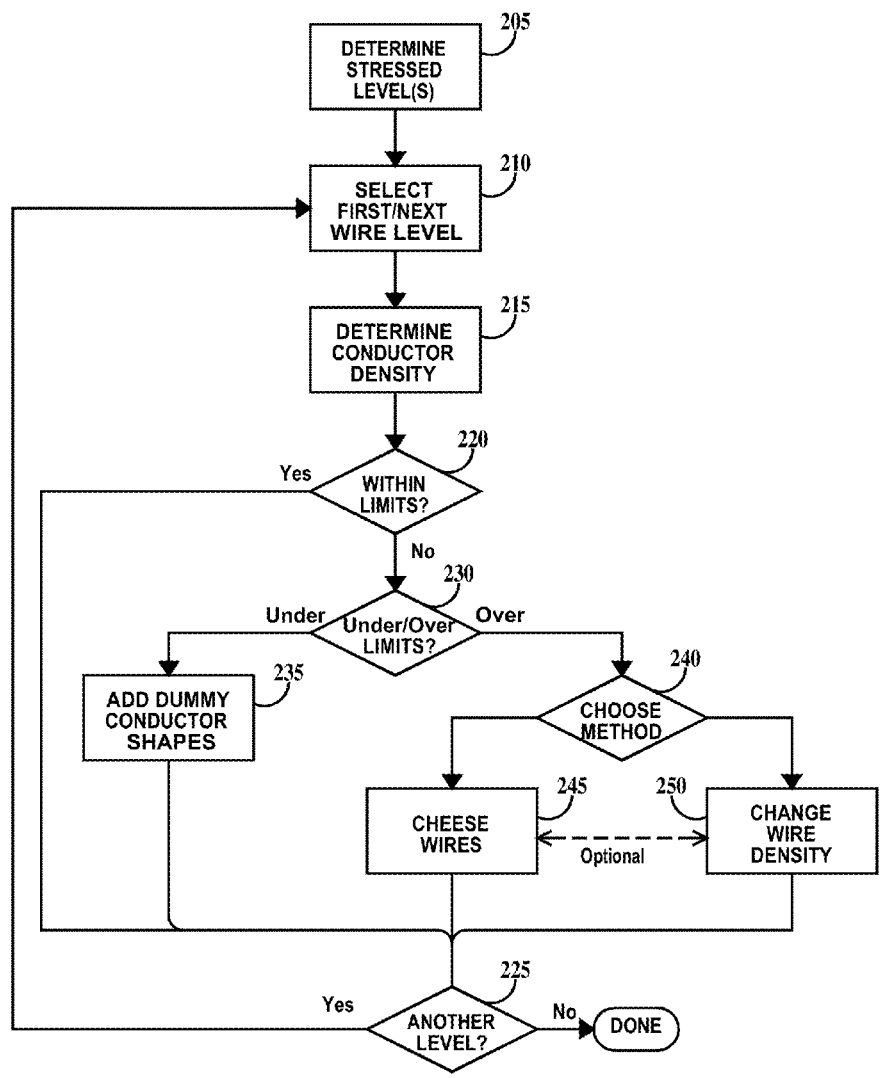
FIG. 5 is a flowchart illustrating a method of controlling wafer curvature according to first embodiments of the present invention.

FIG. 5 is a flowchart illustrating a method of controlling wafer curvature according to first embodiments of the present invention. This method is based on the unexpected result that changing the electrical conductor density of wiring levels can change the amount of wafer curvature, all other process variables being the same. Electrical conductor density is defined as the area of electrically conductive material exposed at the top surface of the level divided by the total area of the level expressed as a percentage.

This method is generally performed on or with the aid of a computer based integrated circuit design system. The goal of the method is to maintain the |RoC| of a 200 mm diameter or 300 mm diameter wafer at greater than about 25 meters during integrated circuit fabrication. In step, 205, the layers that cause wafer curvature (e.g., wiring levels with greater than about 4 micron thick wires, wiring levels with less than about 27% or greater than about 60% electrical conductor density and wiring levels containing highly tensile or compressive films (e.g. greater than an absolute value of about 2 E10 dynes/cm$^2$) of the interconnect film stack are selected, either by manual input or automatically by algorithms looking at the design shapes in the shapes files of the integrated circuit design. When the only electrical conductor presents in a level is in the form of wires, electrical conductor density is wire density. In step 210 the first/next stressed level is selected. The method may be applied to all levels, not just stressed levels, which would apply the steps infra to all levels including the stressed levels.

In step 215, the electrical conductor density is determined. This is a global chip density, that is, the density of electrical conductor for the whole chip, not regions of the chip.

In step 220, it is determined if the electrical conductor density (hereinafter "density" or "conductor density") is within limits (i.e. a predefined density range). In one example the density range is between a lower limit about 27% and an upper limit about 60%). The limits "between about 27% and about 60%" are critical to balance stress induced into the wafer by the conductor of a level and stress induced into the wafer by the ILD layer of the level in the physical chip.

In step 220, it is determined if the density is within limits. It the density is within limits, then the method proceeds to step 225 where is determined if another level is to be examined. If another level is to be examined, the method loops back to step 210, if not, the method terminates.

Returning to step 220, if in step 220 it is determined that the density is not within limits, then the method proceeds to step 230. In step 230, it is determined if the density is over or under the limits. If the density is under the limit then the method proceeds to step 235.

Figure 6:
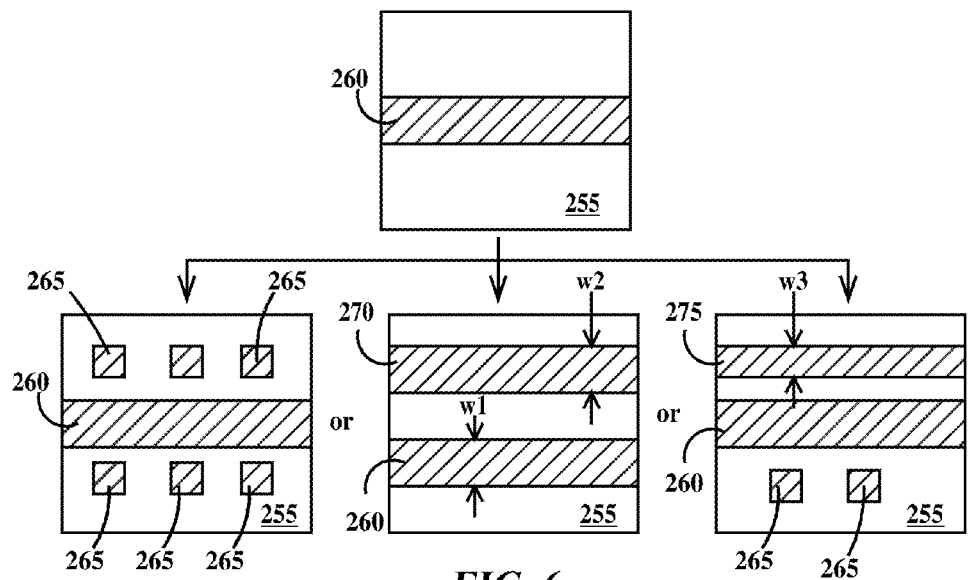
FIG. 6 illustrates, in top view, step 235 of FIG. 5.

In step 235, fill shapes are added to individual regions of the level design so as to bring the global chip electrical conductor shape density of the level design to within the limits. A computer algorithm may be employed or the fill shapes added to locations and at a size and density inputted by a user. This may be recursive process, with fill shapes added and the density recalculated. A limit on the number of loops may be established or user intervention requested. The result of the design process of step 235 on the physical chip is illustrated in step 235 is illustrated in FIG. 6 and described more fully infra. Fill shapes, in metal levels, result in electrically conductive dummy fill shapes on the physical chip. Addition of fill shapes may not be allowed in certain local regions, for example, near certain wire shapes, to avoid inducing noise into the signal carried by those wires in the physical chip. Next the method proceeds to step 225. Step 225 was discussed supra.

Returning to step 230, if in step 230, it is determined if the density is under over the limit then the method proceeds to step 240. In step 240, a choice is made between two methods, the method of step 245 or the method of step 250. However, it is possible to perform both steps 245 and 250 in any order, particularly if one method does not result in the desired decrease in global density. For example, step 245 may be performed in some regions of the chip and step 250 performed in other regions of the chip, particularly when/where wires are two narrow to perform step 245. The choice may be by computer algorithm, computer lookup rule, or human input.

Figure 7:
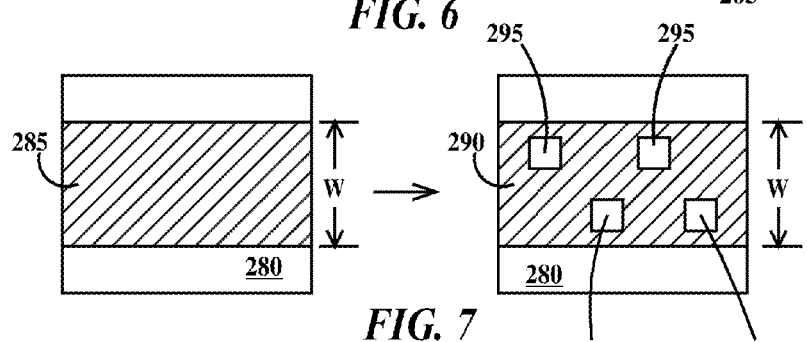
FIG. 7 illustrates, in top view, step 245 of FIG. 5.

Assuming step 245 is selected, then in step 245, wire shapes are selected and "cheesed" in individual regions of the chip so as to bring the global conductor shape density of the level design to within the limits. Cheesing is a form of adding negative fill shapes. The result of the design process of step 245 on the physical chip is illustrated in is illustrated in FIG. 7 and described more fully infra. Negative fill shapes result in pillars of ILD within the perimeter of wires in the physical chip. Certain wire shapes may be too narrow to cheese and certain wire shapes may be designated not to be cheesed, for example, so as not to affect the inductance of the physical wire on the chip. Next the method proceeds to step 225, described supra, or optionally to step 250 and then step 225.

Figure 8:
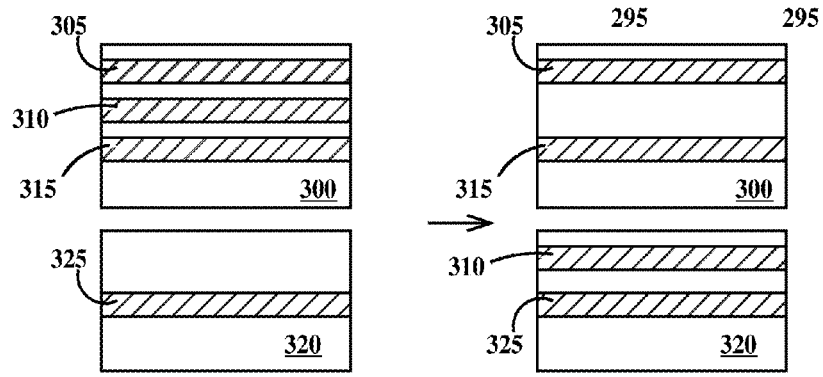
FIG. 8 illustrates, in top view, step 250 of FIG. 5.

Assuming in step 240 that step 250 is selected, then in step 250, local wire shape is density is examined, and where the local wire shape density exceeds the density limits, wire shapes are moved or rerouted to areas where the local density is below the density limits so as to bring the global chip density of the level design to within the limits. This process may be a recursive process with a limit on the number of loops. Certain wire shapes may be designated not to be moved and certain regions may be designated where the below limit shape density is to be maintained. The result of the design process of step 250 on the physical chip is illustrated in FIG. 8 and described more fully infra. Next the method proceeds to step 225, described supra, or optionally to step 245 and then step 225.

In FIGS. 6, 7 and 8, which are top views, the surface of conductors is signified by cross-hatching, while the surface of dielectrics is clear. The conductors are all damascene and/or dual-damascene structures.

FIG. 6 illustrates, in top view, step 235 of FIG. 5. In FIG. 6, a wire 260 exits in region 255 of an integrated circuit having too low a conductor density. There are three possible methods to increase the conductor density of region 255. (1) Adding fill shapes to the dielectric regions of the design results in dummy fill shapes 265 and wire 260 in now modified region 255. (2) Adding a dummy wire shape to the design results in a dummy wire 270 and wire 260 in now modified region 255. (3) Adding both dummy wire shapes and fill shapes to the design results in wire 260, a dummy wire 275, and dummy fill shapes 265 in a now modified region 255. Thus the conductor density is increased in modified regions 255 from that of unmodified region 255.

Fill shapes exist in shapes files of wiring levels of a circuit design and become photomask shapes on photomasks generated from the circuit design. Fill shapes result in dummy fill shapes on actual integrated circuits. Dummy fill shapes exist as single-damascene or dual-damascene conductor filled islands between single-damascene or dual-damascene wires and vias in a wiring level of an integrated circuit. A dummy fill shapes is not electrically connected to any wire, via, dummy wire or other dummy fill shape contained in the same wiring level as the dummy shape or to any other wire or via in other wiring levels. Dummy wires are wires that are not electrically connected to any wire, via or other dummy wire contained in the same wiring level as the dummy wire or to any other wire or via in other wiring levels. Fill shapes tend to be simple squares or rectangles and are often added automatically by a computer algorithm that controls shape, size, pattern, and location of the fill shape relative to wire shapes. Dummy wires look like actual wires. Dummy fill shapes and dummy wire shapes are fabricated simultaneously with normal wire shapes.

FIG. 7 illustrates, in top view, step 245 of FIG. 5. In FIG. 7, a wire 285 having a width W exits in region 280 of an integrated circuit having too high a conductor density. By cheesing wire 285 to produce a wire 290 of width W having dielectric islands 295 the conductor density is decreased in now modified region 280. Cheesing is accomplished by adding fill shapes to design of wire 285. Dummy fill shapes exist as dielectric islands (i.e., dielectric dummy shapes) embedded in single-damascene or dual-damascene wires. Fill shapes 295 define regions of wire 290 that will not contain electrical conductor. Thus the conductor density is decreased in modified region 280 from that of unmodified region 280.

FIG. 8 illustrates, in top view, step 250 of FIG. 5. In FIG. 8, wires 305, 310 and 315 exit in region 300 of an integrated circuit having too high a conductor density and a wire 325 exists in a region 320 of an integrated circuit having a lower conductor density (may be below or within conductor density limits). By moving wire 310 from region 300 to region 320 now modified regions 300 and 320 have conductor densities within the limits. Thus the conductor density is decreased in modified region 300 from that of unmodified region 300 and increased in modified region 320 from that of unmodified region 320 with both modified regions with the conductor density limits.

Figure 9:
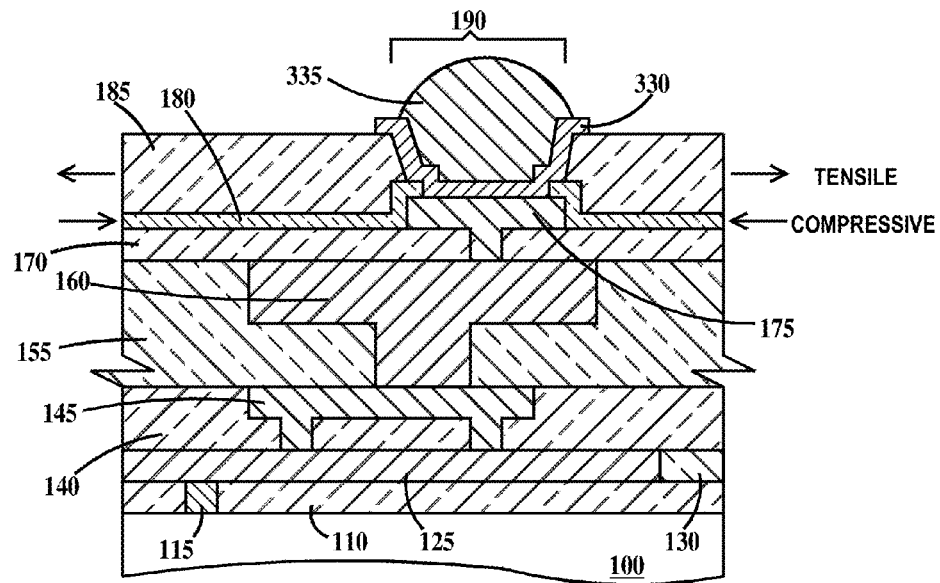
FIGS. 9 and 10 are a cross-sections of an exemplary wafer illustrating a method and structure for controlling wafer curvature according to a second embodiment of the present invention.
Figure 10:
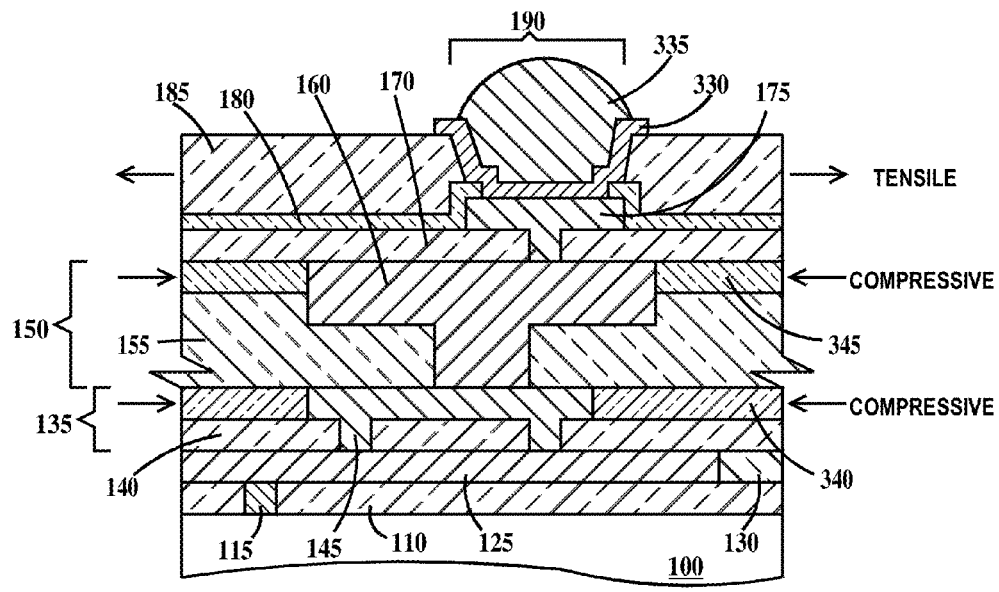
Figure 11:
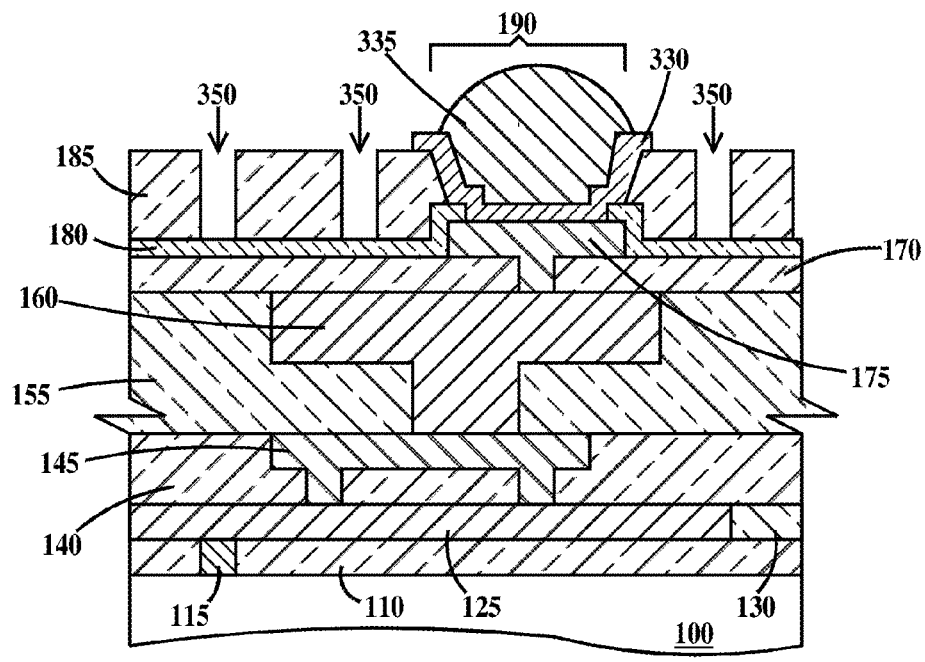
FIG. 11 is a cross-sections of an exemplary wafer illustrating a method and structure for controlling wafer curvature according to a third embodiment of the present invention.

FIGS. 9, 10 and 11 are a cross-sections of exemplary wafers illustrating methods and structures for controlling wafer curvature according to a second embodiment of the present invention where the stress induced by a material in first wiring level or the polyimide layer is compensated for by stress induced into the wafer by a material in a second wiring level.

FIG. 9 is similar to FIG. 1 except polyimide layer 185 is in tensile stress and passivation layer 180 has been fabricated using a process that results in an internally compressively stressed (or the amount of compressive stress increased) passivation layer 180 to counteract the tensile stress of polyimide layer 185, thus reducing or eliminating wafer curvature caused by polyimide layer 185. Also, a pad limiting metal (PLM) and solder bump 335 have been formed in via 190. The goal of the method/structure of FIG. 9 is to maintain the |RoC| of a 200 mm diameter or 300 mm diameter wafer at greater than about 25 meters. A first exemplary method of making passivation layer 180 compressive is to form passivation layer 1890 using a PECVD process. A second exemplary method is to use a sandwich of films such as PECVD $SiO_2$/PECVD TEOS/PECVD FSG for passivation layer 180. This sandwich can induce a compressive stress of about $-0.03E10$ dynes/$cm^2$ to about $-0.20E10$ dynes/$cm^2$ into wafer 100. A third exemplary method is to form passivation layer 180 from a high density CVD (HDCVD) $SiO_2$ which can induce a compressive stress of about $-0.10E10$ dynes/$cm^2$ to about $-0.30E10$ dynes/$cm^2$ into wafer 100. A fourth exemplary method is to form passivation layer 180 from PECVD silicon nitride ($Si_3N_4$) which can induce a compressive stress of about $-0.07E10$ dynes/$cm^2$ to about $-3.0E10$ dynes/$cm^2$ into wafer 100. All these methods compensate for the stress induced into wafer 100 by a tensile polyimide layer 185.

FIG. 10 is similar to FIG. 1 except polyimide layer 185 is in tensile stress and a first compressive dielectric layer 340 has been added to third wiring level 135 and a second compressive dielectric layer 345 has been added to fourth wiring level 150. The goal of the method/structure of FIG. 10 is to maintain the |RoC| of a 200 mm diameter or 300 mm diameter wafer at greater than about 25 meters. In one example layers 330 and 335 are independently selected from the group consisting of a PECVD material, a sandwich of films such as PECVD $SiO_2$/PECVD TEOS/PECVD FSG, HDCVD $SiO_2$ and PECVD $Si_3N_4$. In one example, layers 330 and 335 are independently internally compressively stressed between about $-0.03E10$ dynes/$cm^2$ to about $-3.0E10$ dynes/$cm^2$. The location and number of added compressive films is exemplary, and as few as one and more than two may be added.

FIG. 11 is a cross-sections of an exemplary wafer illustrating a method and structure for controlling wafer curvature according to a third embodiment of the present invention. The goal of the method/structure of FIG. 11 is to maintain the |RoC| of a 200 mm diameter or 300 mm diameter wafer at greater than about 25 meters. FIG. 11 is similar to FIG. 1, except, trenches 350 have been etched into polyimide passivation layer 185. This has the effect of reducing or eliminating any stress induced into wafer 100 by a tensile polyimide layer 185. Trenches extend completely through polyimide layer 185 to passivation layer 180. In one example, trenches 340 are simultaneously formed with via 190 in polyimide layer 185 exposing terminal pad 175 in the bottoms of said via 190 and passivation layer 180 but not terminal pad 175 in the bottom of trenches 340.

Figure 12:
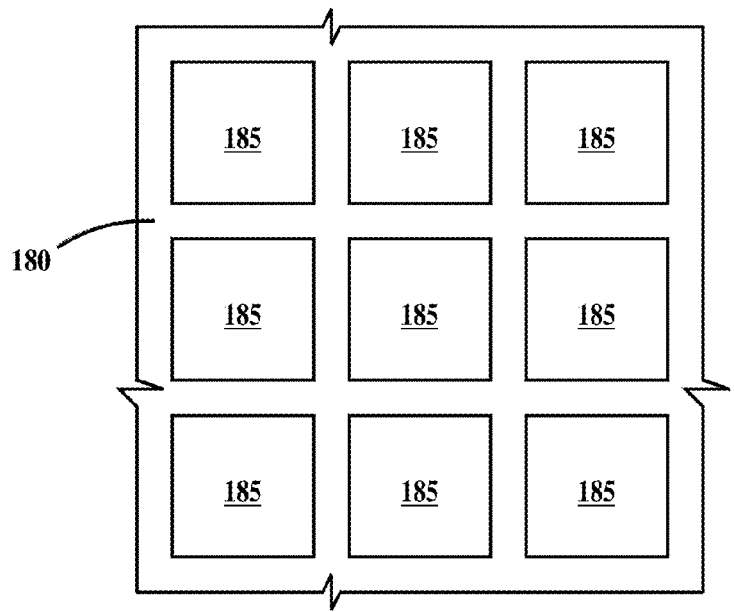
FIG. 12 is a top view of the method/structure of FIG. 11.

FIG. 12 is a top view of the method/structure of FIG. 11. In FIG. 12, islands of polyimide passivation 185 are surrounded by regions of exposed passivation layer 180. In one example, each island of polyimide passivation layer 185 is about the size of an individual integrated circuit chip. In one example, there may be tens to thousands of islands of polyimide passivation layer 185 over each individual integrated circuit chip on the wafer.

Generally, the method described herein with respect to changing the wiring density of integrated circuits is practiced with a general-purpose computer and the methods described supra in the flow diagrams of FIGS. 4, 5, 6 and 7 may be coded as a set of instructions on removable or hard media for use by the general-purpose computer.

Figure 13:
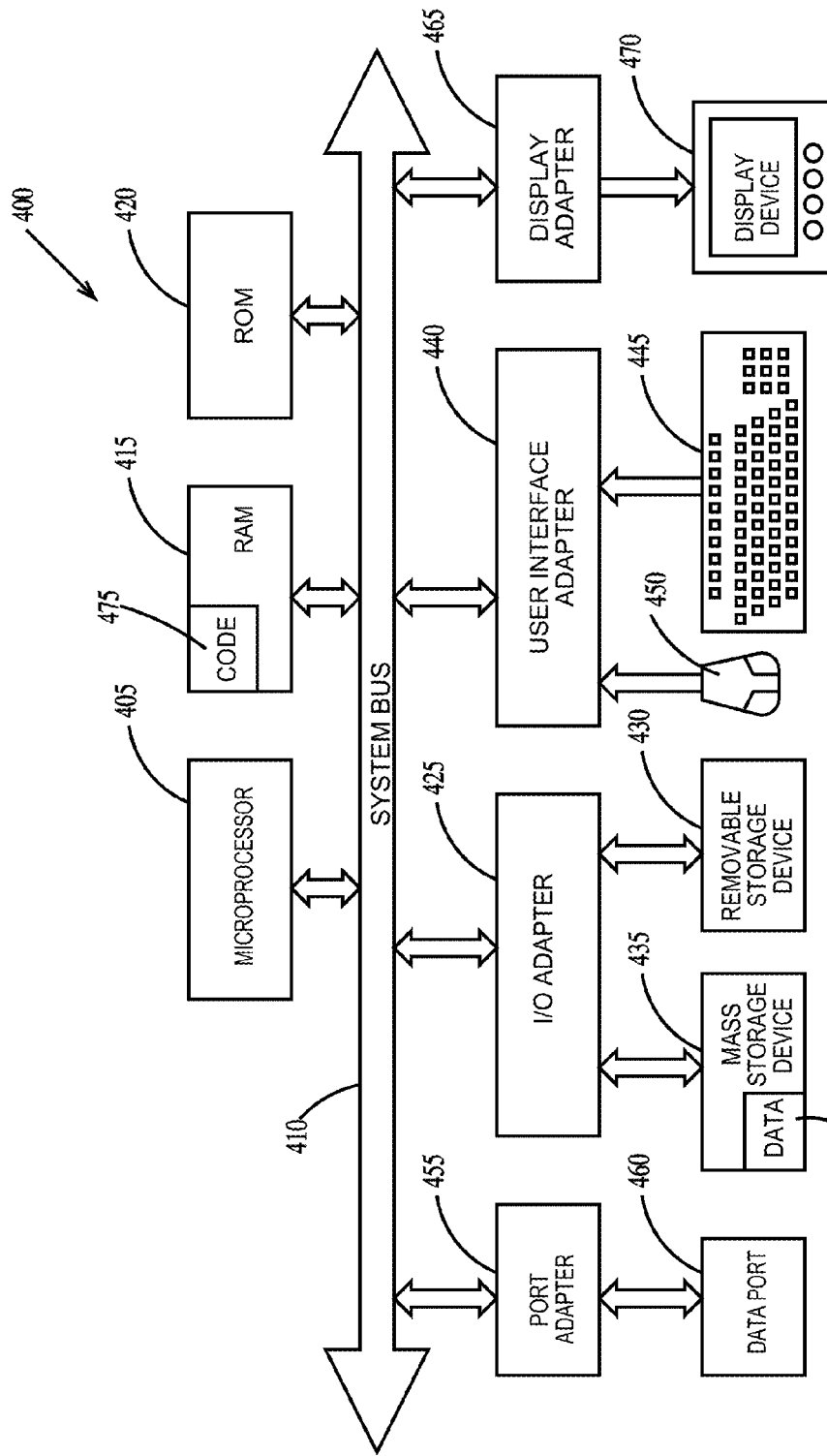
FIG. 13 is a schematic block diagram of a general-purpose computer.

FIG. 13 is a schematic block diagram of a general-purpose computer. In FIG. 11, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, the embodiments of the present invention provide a method to methods and structures for methods and structures for controlling wafer curvature during integrated circuit manufacture.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) selecting a wiring level design of an integrated circuit design, said design defining a physical wiring level of an integrated circuit chip on a wafer, wherein said physical wiring level comprises wires comprising an electrical conductor in an interlevel dielectric layer;
   after (a), (b) determining if an electrical conductor shape density of said wiring level design is within a pre-defined range, said pre-defined range having a lower limit and a different upper limit;
   after (b), (c) if said electrical conductor shape density is below said lower limit of said range, increasing said electrical conductor shape density, if said electrical conductor shape density is between said lower limit and said upper limit not changing said electrical conductor shape density, if said electrical conductor shape density is greater than an upper limit of said range, decreasing said electrical conductor shape density;
   after (c), (d) fabricating said one or more of said integrated circuit chips on said wafer using said wiring level design; and
   wherein said decreasing said electrical conductor shape density comprises moving a shape that defines a wire of said integrated circuit from a first region of said wiring level to a second region of said wiring level.

2. The method of claim 1,
   wherein said increasing said electrical conductor shape density comprises (i) adding fill shapes to said wiring level design, (ii) adding dummy wiring shapes to said wiring level design, or (iii) adding fill shapes and dummy wire shapes to said wiring level design; and
   wherein said fill shapes and said dummy wiring shapes define regions of said wiring level that will contain an electrical conductor.

3. The method of claim 1, wherein said decreasing said electrical conductor shape density further includes adding fill shapes to selected wire shapes of said wiring level design, said selected wire shapes having width greater than a preselected minimum width, said fill shapes defining regions of corresponding selected wires that will not contain an electrical conductor.

4. The method of claim 1, wherein said wires have a thickness greater than 4 microns.

5. The method of claim 1, wherein said wafer maintains an absolute radius of curvature is greater than 25 meters during said fabricating.

6. The method of claim 1, wherein said electrical conductor shape density is the area of electrically conductive shapes divided by a total area of the level and said pre-defined density range is between 27% and 60%.

7. The method of claim 1, wherein said wires of said wiring level are embedded in said interlevel dielectric layer and top surface of said wires are coplanar with a top surface of said interlevel dielectric layer.

8. The method of claim 2, wherein said fill shapes result in dummy fill shapes are in the form of electrically conductive islands and said dummy wiring shapes result in electrically conductive dummy wires in said physical wiring level of said integrated circuit chip, said dummy fill shapes not electrically connected to any wire, dummy wire or other dummy fill shape of said physical wiring level, and said dummy wires not electrically connected to any wire, other dummy wire or dummy fill shape of said physical wiring level.

9. The method of claim 2, wherein said fill shapes are added to said wiring level design using a computer algorithm.

10. The method of claim 9, wherein said fill shapes are not added in preselected regions of said wiring level design.

11. The method of claim 3, wherein said fill shapes are added to said wiring level design using a computer algorithm.

12. The method of claim 11, wherein said fill shapes are not added in preselected regions of said wiring level design.

13. The method of claim 1, including:
repeating (b) and (c) multiple times.

14. The method of claim 1, including:
repeating (a) through (c) for multiple different design levels before performing (d).

15. The method of claim 1, wherein said wires of said wiring level are in internal tensile stress and an interlevel dielectric layer of said wiring level is in internal tensile stress.

* * * * *